United States Patent [19]

Shulman

[11] Patent Number: 5,412,598
[45] Date of Patent: May 2, 1995

[54] BISTABLE FOUR LAYER DEVICE, MEMORY CELL, AND METHOD FOR STORING AND RETRIEVING BINARY INFORMATION

[75] Inventor: David D. Shulman, Ocean Township, Ocean County, N.J.

[73] Assignee: The University of British Columbia, Vancouver, Canada

[21] Appl. No.: 192,047

[22] Filed: Feb. 4, 1994

Related U.S. Application Data

[63] Continuation-in-part of Ser. No. 874,467, Apr. 27, 1992, Pat. No. 5,285,083.

[51] Int. Cl.[6] ...................... H01L 29/74; H01L 29/80
[52] U.S. Cl. .................................... 365/174; 365/180; 257/107; 257/106; 257/105
[58] Field of Search ................. 365/174, 180; 257/107, 257/106, 105

[56] References Cited

U.S. PATENT DOCUMENTS

5,132,767 7/1992 Ogura et al. ........................... 357/38

OTHER PUBLICATIONS

Yang; "On The Variation Of Small-Signal Alphas Of A p-n-p-n Device With Current"; 22 Aug., 1966; pp. 641-648.
Voulgaris; "Linear Operation of a p-n-p-n Tetrode"; 5 May, 1969; pp. 468-478, vol. ED-16.
Voulgaris; "Linear Applications of a p-n-p-n Tetrode"; 4 Aug., 1970; pp. 146-150 vol. Sc-5.
Elmasry; "SDW MOSFET Static Memory Cell"; 2 Apr., 1981; pp. 80-85; vol. Sc-16.
Wu; "Correspondence"; 2 Apr., 1983; pp. 222-224; vol. Sc-18 No. 2.
Anderson; "Metal-Semiconductor contacts on hydrogenated amorphous silicon films"; 11 Apr., 1986; pp. 317-329; vol. 54, No. 4.
Roulston; "Efficient Modeling of Thyristor Static Characteristics from Device Fabrication Data"; 2 Feb., 1979; pp. 143-147; vol. Ed-26, No. 2.
Coleman; "Current Transport in Metal-Semiconductor-Metal (MSM) Structures"; 1 Apr., 1979; pp. 1209-1218; vol. 14.
Gerhard Weil; "Integrated Pacemakers"; pp. 67-73; vol. Sc-5, No. 2.
Reisch; "On Bistable Behavior and Open-Base Breakdown of Bipolar Transistors in the Avalanche Regime Modeling and Applications"; pp. 1398-1409; 6 Jun., 1992; vol. 39, No. 6.
Sakui; "New Static Memory Cell Based on the Reverse Base Current Effect of Bipolar Transistors"; pp. 1215-1217; vol. 36, No. 6.
"Theory of p-n-p-n Operation" pp. 82-87.

Primary Examiner—Viet Q. Nguyen
Attorney, Agent, or Firm—Oyen Wiggs Green & Mutala

[57] ABSTRACT

A new static memory cell based on the bistable operation of a three-terminal four layer semiconductor device working in the forward blocking state is disclosed. The power consumption of the memory cell is low. The switching speed of the memory cell is in the nanosecond range. The memory cell may be integrated into VLSI processes and is of a size suitable for VLSI applications. The memory cell comprises a semiconductor device which comprises: an n-type semiconductor cathode region; a p-type semiconductor gate region; a third semiconductor region adjacent the gate region; a fourth region adjacent the third semiconductor region; and a hole-injecting boundary between the third semiconductor region and the fourth region. The semiconductor device is preferably a p-n-p-n device. The gate current-voltage characteristics of the device comprise a negative resistance region. The device is designed to operate in a forward blocking low current state. The memory cell further comprises a gate load element and a power supply for biasing the device. When the device is properly biased and is connected to a suitable gate load element it can operate in one of two bistable states characterized by different gate-cathode voltages. The state of the device can be switched by applying suitable pulses to the gate.

7 Claims, 5 Drawing Sheets

BISTABLE FOUR LAYER DEVICE, MEMORY CELL, AND METHOD FOR STORING AND RETRIEVING BINARY INFORMATION

RELATED APPLICATIONS

This application is a continuation-in-part of application Ser. No. 07/874,467 filed 27 Apr. 1992, now U.S. Pat. No. 5,285,083.

FIELD OF THE INVENTION

This invention relates to a four layer electronic device capable of bistable operation and suitable for use as a memory cell, to a low voltage, small area memory cell which uses the device and to a method for storing and retrieving binary information using the device. The memory cell may be fabricated as part of a VLSI circuit.

BACKGROUND

Modern computerized devices require significant amounts of memory. Such memory is often provided in the form of Static Random Access Memory (SRAM). The electronics industry is seeking ways to make SRAMs which are smaller and consume less power.

It is well known that the anode current-voltage (I-V) characteristics of p-n-p-n devices may display negative resistance. Negative resistance occurs in the range of voltages over which increasing the voltage across the device between the anode and cathode causes the current through the device to diminish. The negative resistance region is bounded by a high-conduction "on" region and a low-conduction "off" region.

The occurrence of a negative resistance region in the anode current-voltage characteristics of p-n-p-n devices has been previously used to implement relaxation oscillators in integrated circuit pacemakers. It is further known that p-n-p-n devices may be operated in the "off" state as small-signal amplifiers.

Sakui et al. *A new static memory cell based on the reverse base current effect of bipolar transistors,* IEEE Transactions on Electronic Devices vol. 36 No. 2, p. 1215, 1989 propose a static memory cell, consisting of one bipolar transistor and one FET. In the Sakui et al. device the bipolar transistor is operated under weak avalanche conditions. The Sakui et al. memory cell consumes relatively large amounts of power in its "on" state. Furthermore, the avalanche effect requires supply voltages of at least 2.5 V.

SUMMARY OF THE INVENTION

The invention provides a method for storing binary information. The method comprises the steps of providing: a data line for carrying the binary information; a semiconductor device comprising an anode, a cathode and a gate; a field effect transistor having a gate a source and a drain connected between the data line and the gate by the source and drain; a read/write control line operatively connected to the gate of the field effect transistor; and biasing means for applying a bias voltage to said anode with respect to the cathode, applying a bias voltage within a range to the device; and writing data to the device. The semiconductor device having an "off" state characterized by high impedance between the anode and cathode, remaining in said "off" state while having a current gain greater than 1 while the bias voltage is maintained in the range of voltages; having a gate current-voltage curve comprising a negative resistance region while the bias voltage is maintained within the range voltages; and having a pair of bistable states characterized by gate voltages $V_{G1}$ and $V_{G2}$. The step of writing data to the device comprises: writing a bit of information to the device by the steps of:

1. setting the data line to a voltage either higher than $V_{G2}$ or lower than $V_{G1}$;
2. applying a voltage to the read/write control line to switch the field effect transistor into a low impedance state; and
3. changing the voltage on the read/write control line to switch the field effect transistor into a high impedance state.

A second aspect of the invention provides a method for storing and retrieving binary information. The method comprises the steps of:

1. providing a semiconductor device comprising an n-type cathode region, a p-type gate region adjacent the cathode region, a third semiconductor region adjacent the gate region and an anode region adjacent the third semiconductor region, the gate current-voltage curve of the semiconductor device comprising a negative resistance region over a first range of anode-cathode voltages;
2. providing means to apply a selected bias voltage within the first range between the anode and cathode regions;
3. providing a gate load element in series electrical connection between the gate region and a signal source, the gate load device having an electrical impedance such that when the selected bias voltage is applied to the device and the signal source is not producing a signal, the device has first and second stable states characterized by gate-cathode voltages $V_{G1}$ and $V_{G2}$ respectively;
4. maintaining the device in a forward blocking state;
5. storing a bit of information by applying a positive pulse from the signal source to shift the device into the first state or a negative pulse from the signal source to shift the device into the second state; and
6. retrieving the bit of information by measuring the anode-cathode voltage.

A third aspect of the invention provides a semiconductor device capable of bistable operation, the device comprising:

1. an n-type semiconductor cathode region;
2. a p-type semiconductor gate region adjacent the cathode region;
3. a depletion zone between the cathode region and the gate region;
4. a third semiconductor region adjacent the gate region;
5. an anode region adjacent the third semiconductor region; and
6. a hole-injecting boundary between the third semiconductor region and anode region;

the device having an "off" state characterized by a high impedance between the anode and cathode wherein a maximum current gain of the device is greater than one when the device is in its "off" state.

A fourth aspect of the invention provides a memory cell comprising:

1. a four layer semiconductor device comprising a n-type cathode region; a p-type gate region; a third semiconductor region adjacent the gate region, and an anode region adjacent the third semiconductor region;

2. bias means for applying a bias voltage between the anode and cathode regions, the bias voltage such that a junction between the third semiconductor region and the gate region is reversed biased, the device is in a high impedance "off" state and a gate current-voltage curve of the semiconductor device comprises a negative resistance region;
3. a data line; and
4. a gate load element in series electrical connection between the gate region and the data line;

wherein, when the bias voltage is applied to the device, the memory cell has first and second stable states characterized by gate voltages $V_{G1}$ and $V_{G2}$ respectively.

A fifth aspect of the invention provides a memory cell comprising:

1. a semiconductor device comprising anode, cathode and gate, the semiconductor device having a maximum current gain larger than 1 when the semiconductor device is in a high impedance "off" state;
2. bias means for applying a bias voltage between the anode and cathode regions, the bias voltage such that a gate current-voltage curve of the semiconductor device comprises a negative resistance region when the semiconductor device is in its "off" state;
3. a data line; and
4. a gate load element in series electrical connection between the gate and the data line.

BRIEF DESCRIPTION OF THE DRAWINGS

In drawings which illustrate specific embodiments of the invention, but which should not be construed as restricting the spirit or scope of the invention in any way.

DETAILED DESCRIPTION OF THE PREFERRED EMBODIMENT

The bistable device according to the invention is characterized in that it provides a negative resistance region in the gate-cathode I-V curve of the device. This negative resistance region can be used to produce a memory effect. In contrast to the well known negative resistance displayed by the anode-cathode I-V characteristics of p-n-p-n devices, the negative resistance of the gate-cathode I-V curve in a device according to the invention can be exhibited when the device is operating in a low-current "off" state (i.e. forward blocking state).

Figure 1:
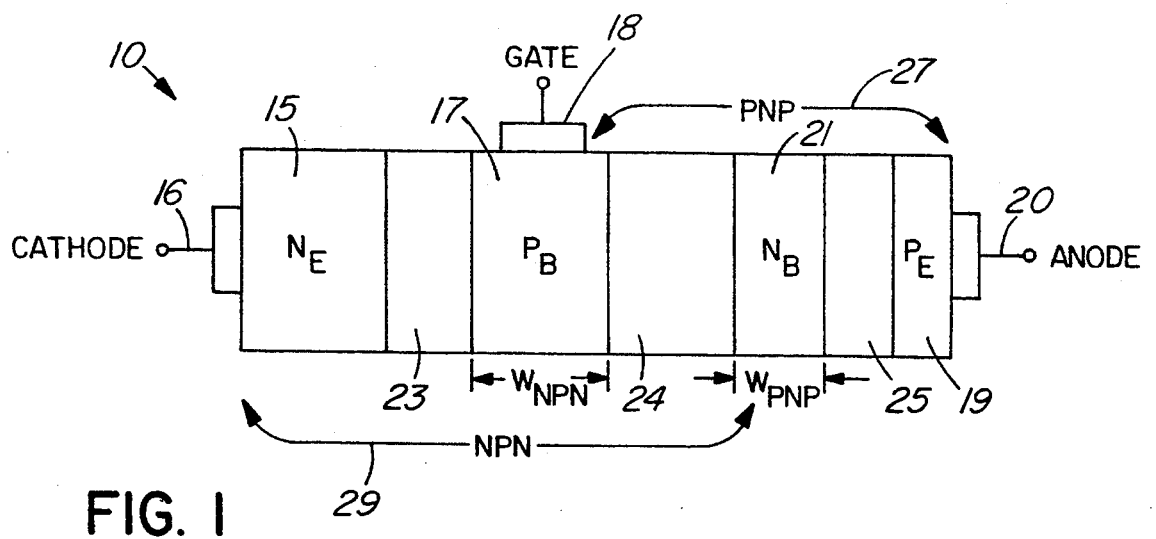
FIG. 1 is a diagram of a section through a three-terminal p-n-p-n device according to the invention.

FIG. 1 shows a p-n-p-n device 10 according to the invention. Device 10 comprises an N-type cathode layer 15, a P-type gate layer 17 adjacent cathode layer 15, a P-type anode layer 19, and an N-type layer 21 between anode layer 19 and gate layer 17. Device 10 has external connections 16, 20 and 18 to cathode layer 15, anode layer 19 and gate layer 17 respectively. Depletion regions 23, 24, and 25 form at each of the junctions between N-type and P-type material in device 10.

Device 10 can be seen as a combination of a p-n-p transistor 27 comprising layers 17, 21 and 19 and an n-p-n transistor 29 comprising layers 15, 17 and 21. $W_{pnp}$ is the base width of p-n-p transistor 27. $W_{npn}$ is the base width of n-p-n transistor 29. The characteristics of transistors 27 and 29 are determined by their physical dimensions and doping profiles.

The common base d.c. current gain, $\alpha$, of a transistor is defined as:

$$\alpha = \frac{(I_c - I_{cbo})}{I_e} \quad (1)$$

where $I_c$ is the collector current, $I_{cbo}$ is the leakage current (i.e. the collector current when the emitter terminal is floating) and $I_e$ is the emitter current. The current gain, $\alpha$, of bipolar transistors 27 and 29 can be expressed as:

$$\alpha = \frac{\gamma}{\cosh(W/L_D)} \quad (2)$$

where $\gamma$ is the emitter efficiency, W is the base width and $L_D$ is the diffusion length of minority carriers in the base region of the transistor.

Figure 2A:
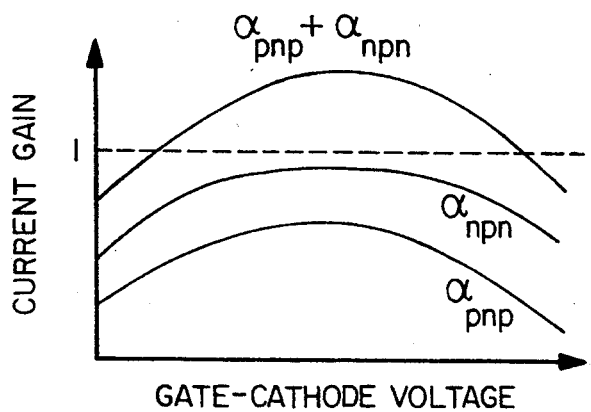
FIG. 2A is a plot of current gain versus gate-cathode voltages for a three-terminal p-n-p-n device in its forward blocking state.

FIG. 2A is a plot showing typical current gains $\alpha_{pnp}$ and $\alpha_{npn}$ of p-n-p transistor 27 and n-p-n transistor 29 respectively as functions of gate-cathode voltage. At low gate-cathode voltages $\alpha_{pnp}$ and $\alpha_{npn}$ are low because of recombination of electrons and holes in space-charge regions 23, and 25. At higher gate-cathode voltages less voltage is dropped across the reverse-biased junction between layers 21 and 17. This decreases the width of depletion zone 24 and consequently increases $W_{pnp}$ and decreases $\alpha_{pnp}$. This effect is augmented if p-n-p transistor 27 is constructed so that the ratio $(W_{pnp}/L_D)$ in p-n-p transistor 27 is greater than one.

At sufficiently high gate-cathode voltages, p-n-p transistor 27 or n-p-n transistor 29, or both, operate in saturation and, consequently, $\alpha_{pnp}$ or $\alpha_{npn}$, or both, decrease. At such high gate-cathode voltages, the effective resistance of device 10 is small and consequently the anode current is determined mainly by whatever external resistance is in series with device 10.

Device 10 can also be viewed as a n-p-n structure 29 to which is attached a hole injecting boundary. The junction between p-type layer 19 and n-type layer 21 serves essentially to inject holes into p-type layer 17. As such, p-type layer 19 could be replaced with an alternative hole-injecting boundary without substantially affecting the operation of device 10. For example, a metal contact on a layer of high resistivity semiconductor forming a Schottky junction may be used to inject holes into layer 17. In this case, the high-resistivity semiconductor corresponds to layer 21 and the semiconductor-metal interface corresponds to layer 19. The high resistivity semiconductor may be, for example, undoped or lightly doped amorphous silicon, polysilicon or silicon.

Figure 2B:
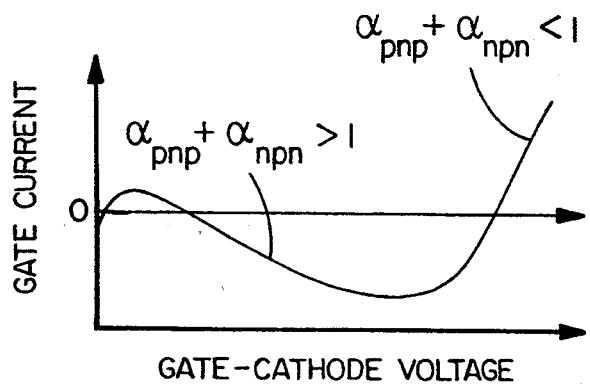
FIG. 2B is a plot of gate current versus gate-cathode voltage for the three terminal p-n-p-n device of FIG. 2A.

FIG. 2B shows the relationship between gate current, $I_G$ and gate-cathode voltage $V_G$ for the device of FIG. 1 under the conditions of FIG. 2A. In device 10, gate current can be related to the anode current and the current gains of transistors 27 and 29 by the equation:

$$I_G = \frac{I_A(1 - \alpha_{pnp} - \alpha_{npn}) - I_{GR}}{\alpha_{npn}} \quad (3)$$

where $I_A$ is the anode current and $I_{GR}$ is the thermally generated current. The anode current is related to the gate and cathode currents by the relationship:

$$I_A = I_K - I_G \quad (4)$$

where $I_K$ is the cathode current. Generally, the cathode current increases with increasing gate voltages $V_G$.

It is desired to operate device 10 as a bistable device having two stable states distinguished by different gate voltages. To accomplish this, the gate current-voltage characteristics of the device must offer two stable states. This can only be the case if there is an inflection in the curve which relates gate current to gate-cathode voltage. For bistable operation the gate load line must intersect the gate I-V curve at three points. This, in turn, requires that the gate characteristics of the device exhibit negative resistance over some range of $V_G$.

Since $I_{GR}$ is normally very low, the sign of the gate current $I_G$ is determined mainly by whether $\alpha_{npn} + \alpha_{pnp}$ is smaller or larger than one. For bistable operation, device 10 is designed for operation in a region where $\alpha_{npn} + \alpha_{pnp}$ first increases to a value greater than 1 with increasing $V_G$ and then decreases below 1 as $V_G$ is increased further. It can be seen from Equations (3) and (4) that if $\alpha_{npn} + \alpha_{pnp}$ is constant and larger than 1 then $I_A$ may increase with larger gate voltages. Consequently, $I_G$ will become more negative. The maximum value of $\alpha_{npn} + \alpha_{pnp}$ must be greater than one. At sufficiently low and high gate voltages $\alpha_{npn} + \alpha_{pnp}$ may be less than one. If $\alpha_{npn} + \alpha_{pnp}$ is less than one at sufficiently high gate voltages the sign of the gate current will be positive. If $\alpha_{npn} + \alpha_{pnp}$ is greater than one at some intermediate voltage then the sign of the gate current will be negative. Consequently, if $\alpha_{npn} + \alpha_{pnp}$ is greater than one at an intermediate voltage then the gate I-V curve must display a negative resistance region. This negative resistance region is necessary for operating device 10 as a low power consumption bistable device according to the invention.

Standard p-n-p-n switching devices typically have a current gain less than 1 in their "off" states. Such standard devices are generally used in power applications which require them to resist large voltages. To accomplish this, a standard p-n-p-n device has a long, relatively lightly doped, n-type base region. While this provides desirable characteristics for power applications, it typically reduces the maximum total current gain to values which are less than 1, too low for use as a bistable device according to the invention.

Maintaining $\alpha_{npn} + \alpha_{pnp} > 1$ could be achieved by making transistors 27 and 29 high-lifetime n-p-n and p-n-p structures. It is not desirable to do so however. If this were done then the resulting p-n-p-n device would switch into the high-conduction "on" state at a very low anode bias current. It is difficult to operate device 10 as a memory cell under these conditions, as can be seen from FIG. 3. If the lifetime throughout device 10 is high then the holding current and voltage (i.e. the minimum current and voltage for which device 10 will remain in its "on" state) will be very low. Furthermore, to operate the circuit shown in FIG. 5A there should be a region in which there is a positive gate current at low gate voltages. This requires that the current gain of device 10 be less than one at low gate voltages. If the current gain of device 10 is very large then it may be difficult to reduce the current gain of device 10 to a value less than one at low gate voltages.

To keep power consumption low, it is desirable to maintain device 10 in its "off" state for memory cell applications. Therefore, the anode current must be maintained below the holding current in such applications. Where the holding current is very low, this requires either a very low supply voltage or a high value anode load resistor. Neither of these options is very practical because there are technological limits to the values of resistors which can be conveniently incorporated into a large scale integrated circuit and the supply voltage must be high enough that the voltage levels corresponding to the two states of device 10 are clearly distinguishable.

A preferred alternative is to design layers 15 and 17 so that n-p-n transistor 29 has a long diffusion length and to design layers 21 and 19 so that p-n-p transistor 27 has a short diffusion length. This can be done using semiconductors having low-mobility and/or a low-lifetime for layers 19 and 21, and semiconductors having a high-mobility and/or a high lifetime for layers 15 and 17. The resulting p-n-p-n device 10 will still have $\alpha_{npn} + \alpha_{pnp} > 1$ at intermediate gate voltages but it will remain in its "off" state at larger voltages and currents.

Figure 4A:
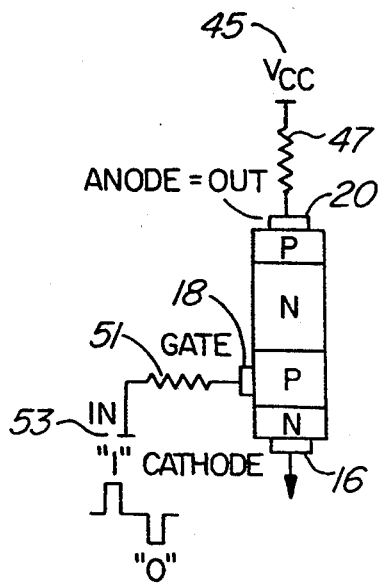
FIG. 4A is a schematic diagram of a memory cell circuit according to the invention.

In a p-n-p-n device 10 constructed in this manner and used in a circuit as shown in FIG. 4A the cathode is partially bypassed. That is, when the device 10 is in its "off" state, most of the anode current flows through the gate and the gate resistor and not through the cathode. Bypassing the cathode as shown in FIG. 4A contributes to the ability of device 10 to maintain a current gain larger than one while remaining in its "off" state even when the value of the anode resistor 47 is relatively small.

The base widths $W_{pnp}$ and $W_{npn}$ are also effective in causing device 10 to behave as shown in FIG. 2. $W_{pnp}$ and $W_{npn}$ are preferably both short (i.e. less than the diffusion length of carriers). A typical diffusion length for electrons in a Silicon semiconductor structure is approximately 10 microns. Consequently, the thicknesses of layers 17 and 21 in device 10 should typically be on the order of 0.5 microns if device 10 is fabricated of Silicon. The density of carriers in device 10 may be, for example: $10^{19}$ cm$^{-3}$ in layer 15; $10^{18}$ cm$^{-3}$ in layer 19; $10^{17}$ cm$^{-3}$ in layer 17; and, $10^{14}$ cm$^{-3}$ in layer 21. The typical lifetime of carriers throughout the structure will typically be on the order of 0.1 microseconds to 1 microsecond.

To obtain relatively high values of $\alpha_{pnp}$ for p-n-p transistor 27 with short diffusion lengths, p-n-p transistor 27 should be biased so that it is operating under nearly punch-through conditions, so that $W_{pnp}$ is very small. Under punch-through conditions, $W_{pnp}=0$. For example, as shown in FIG. 1, the dimension $W_{pnp}$ of device 10 is the distance between the two depletion regions 24 and 25. Depletion region 24 corresponds to the reverse-biased junction between layers 17 and 21. Most of the voltage applied between gate 18 and anode 20 is dropped across depletion region 24. If the gate-anode voltage increases then more voltage is dropped across depletion region 24 and depletion region 24 expands into n-type layer 21. At some point depletion region 24 will touch depletion region 21. At a gate-anode voltage just below the voltage at which $W_{pnp}=0$, p-n-p transistor 27 is operating under "nearly punch-through conditions".

As noted above with respect to FIG. 2A, the decrease in $\alpha_{pnp}$ at higher gate-cathode voltages can be achieved by an increase in $W_{pnp}$ which arises because at higher gate-cathode voltages less voltage is dropped across the junction between layers 17 and 21.

The anode-cathode voltage decreases at higher gate-cathode voltages because, as the current through the external and internal resistances of device 10 increases more voltage is dropped across external load resistances in series with the anode. While the decrease in $\alpha_{pnp}$ at higher gate voltages could be obtained by increasing the resistance of the anode load resistor it is not generally desirable to do so. This is because the junction between layers 17 and 21 may become forward-biased, and, consequently the device may operate in a saturation mode. The device may be slowed down if it operates under saturation conditions because the excess carriers in the base region must be removed before the device will turn off.

Alternatively, $\alpha_{pnp}$ may be decreased by increasing the gate voltage. The effect of increasing the voltage at gate terminal 18 can be seen by imagining device 10 having its anode terminal 20 connected directly to a power supply having a voltage $V_{CC}$ and having its cathode terminal grounded (so that the voltage at cathode 16 is 0 volts). If device 10 is constructed so that $W_{pnp}=0$ when the voltage at gate 18 is 0 volts then device 10 is operating under near punch-through conditions when the gate voltage is zero. If the gate voltage is increased to a voltage $V_G$ between 0 volts and $V_{CC}$ then the anode-gate voltage decreases from $V_{CC}$ to a new value $V_{CC}-V_G$. Consequently, the width of depletion region 24 is reduced and $W_{pnp}$ increases. When $W_{pnp}$ increases $\alpha_{pnp}$ decreases according to Equation (2). During this process, the junction between layers 21 and 17 is never forward-biased. For a given change in $V_G$ the effect on $\alpha_{pnp}$ will be greater if the supply voltage $V_{CC}$ is small. It can be seen that increasing the gate voltage can be particularly effective to produce a significant change in $W_{pnp}$, if device 10 is operated with low power supply voltages. Consequently, device 10 is preferably constructed to be operable at low voltage.

The minimum acceptable supply voltage for a memory cell based upon device 10 is determined by the punch-through voltage of p-n-p structure 27 and by the necessity that the two states of a memory cell based upon device 10 are characterized by voltages which are different enough from each other that they can be distinguished. In principle, the punch-through voltage may be made zero. In a given physical device the punch-through voltage of the p-n-p structure may be non-zero. For example, the approximate value of the punch-through voltage in uniformly doped material with an abrupt junction is given by the formula:

$$V_P = \frac{q \times N_b \times W_M^2}{2 \times \epsilon} \quad (5)$$

where q is the electronic charge, $V_P$ is the punch-through voltage, $N_b$ is the doping level of n-type layer 21, $W_M$ is the thickness of n-type semiconductor in layer 21 and $\epsilon$ is the dielectric constant of the material of layer 21. Equation (5) assumes that $N_b$ is much smaller than the doping level in the adjoining p-type layers 17 and 19, which is generally true, that the applied voltage is much larger than the built-in voltage of the junction (which, for Silicon, is approximately 0.7 volts), and that $W_M$ is large enough that quantum effects may be neglected.

It can be seen from Equation (5) that by adjusting the thickness and doping of n-type layer 21 which forms the base of p-n-p transistor 27 the punch-through voltage of p-n-p transistor 7 may be tailored to have a very low value. In principle, the punch through voltage $V_P$ could be made zero by making either of $N_b$ or $W_M$ equal to zero. In practise, however, there are physical constraints on these quantities. $N_b$ cannot be reduced below the intrinsic carrier density of the material of layer 21 and, while $W_M$ can be made very small, then quantum effects become important and Equation (5) is no longer applicable.

Figure 3:
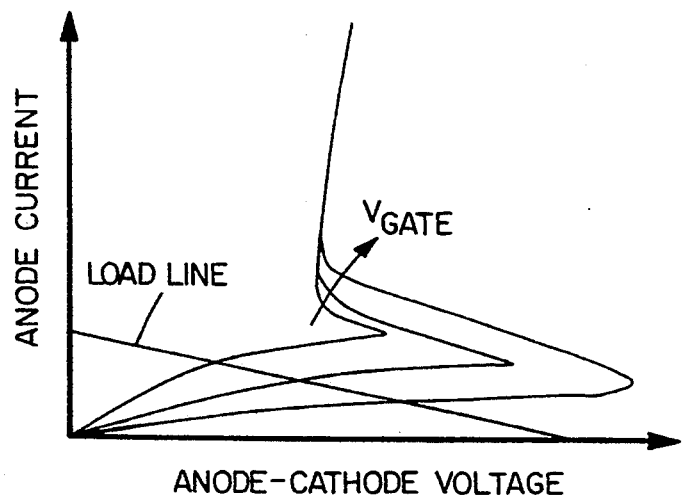
FIG. 3 is a plot of anode current as a function of anode-cathode voltage at various gate voltages for a p-n-p-n device according to the invention.

FIG. 3 is a plot of anode current as a function of supply voltage at various gate voltages for the p-n-p-n device shown in FIG. 1 with a load resistor connected in series with the anode. Device 10 is preferably operated in the "off" state. The supply voltages and load resistances are selected to prevent device 10 from switching into the high conduction region. The conditions which should be maintained to prevent a p-n-p-n device such as device 10 from switching to a high conduction state are well known and are set out, for example, in Voulgaris et al. *Linear operation of a p-n-p-n tetrode*, IEEE Trans. Electron. Devices vol. ED-16 p. 468, 1969 which is incorporated herein by reference.

FIG. 4A is a schematic diagram of a memory cell circuit 40 in which device 10 is the active element. Circuit 40 comprises a power supply 45 to provide a suitable bias voltage $V_{CC}$ for device 10 and an anode load resistor 47 connected in series between power supply 45 and anode connection 20 of device 10. Cathode connection 16 of device 10 is connected to ground. Gate connection 18 of device 10 is connected through a gate load resistor 51 to a signal source 53.

Figure 4B:
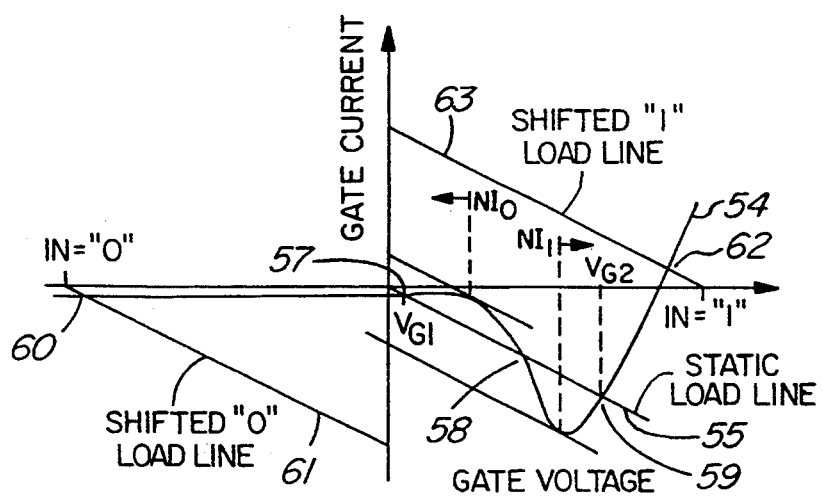
FIG. 4B is a plot of the gate I-V characteristics of the p-n-p-n device in the circuit of FIG. 4A with superimposed load lines.

In operation, as illustrated in FIG. 4B, circuit 40 has two quasi-stable states distinguished by different gate voltages $V_{G1}$ and $V_{G2}$. Circuit 40 can be switched into its higher gate-voltage state (the "1" state) by applying a positive pulse from signal source 53. Circuit 40 can be switched into its lower gate-voltage state (the "0" state) by applying a negative pulse from signal source 53.

When no signal is provided by signal source 53 circuit 40 does not change state. The static noise immunity of circuit 40 is found by drawing gate load lines on gate I-V curve 54 which is shown in FIG. 4B. Load line 55 corresponds to the situation when the output of signal source 53 is grounded. The slope of load line 55 is inversely proportional to the resistance of gate load resistor 51.

It can be seen that load line 55 intersects gate I-V curve 54 at three operating points 57, 58 and 59. Operating point 57 corresponds to the "0" state of circuit 40, operating point 59 corresponds to the "1" state of circuit 40. Operating point 58 is unstable. If circuit 40 is operating at operating point 58 then it will spontaneously switch to operate at one of operating points 57 and 59. Operating points 57 and 59 correspond to gate voltages $V_{G1}$ and $V_{G2}$ respectively. If Circuit 40 is in its "0" state it will remain in the "0" state as long as the gate voltage is held below voltage $NI_0$. If circuit 40 is in its "1" state it will remain in that state as long as the gate voltage is maintained above voltage $NI_1$. Voltages $NI_0$ and $NI_1$ get closer to each other as the resistance of gate load resistor 51 is decreased (which causes static load line 55 to become steeper). This tendency is limited, however, by the fact that there will eventually be only one intersection of gate I-V curve 54 with static gate load line 55. At this point, circuit 40 will not be capable of bistable operation.

Circuit 40 can be forced into its "0" state by providing a negative pulse of voltage $-V_S$, from signal source 53. During the time that voltage $-V_S$ is applied to gate resistor 51 then the operating point 60 of circuit 40 lies on shifted load line 61. The intercepts of load line 61 with the axes of FIG. 4B are the points $I_G=0$, $V_G=-V_S$ and $I_G=-V_S/R_G$, $V_G=0$. When signal source 53 is subsequently grounded then circuit 40 switches to operating point 57 (its "0" state).

Circuit 40 can be forced into its "1" state by providing a positive pulse of voltage $+V_S$ from signal source 53. During the time that voltage $+V_S$ is applied to gate resistor 51 the operating point 62 of circuit 40 lies on shifted load line 63. The intercepts of load line 63 with the axes of FIG. 4B are the points $I_G=0$, $V_G=+V_S$ and $I_G=+V_S/R_G$, $V_G=0$. When signal source 53 is subsequently grounded then circuit 40 switches to operating point 59 (its "1" state).

Figure 5A:
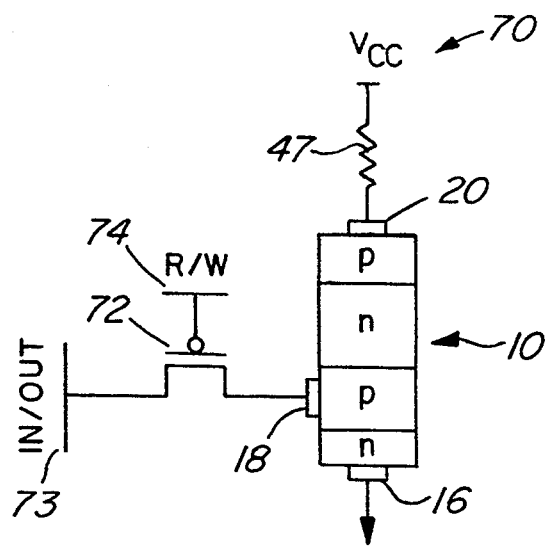
FIG. 5A is a schematic diagram of an alternative memory cell circuit according to the invention; and, FIG. 5B is a plot showing the gate current-voltage characteristics of a p-n-p-n device according to the invention in the circuit of FIG. 5A.

FIG. 5A shows an alternative circuit 70 which uses a field effect transistor ("FET") 72 to switch device 10 between its "0" and "1" states. FET 72 replaces gate load resistor 51 of circuit 40. FET 72 is preferably a PMOS transistor. FET 72 has a gate connected to a read/write line 74 and a terminal connected to a data line 73. By using FET 72 to switch device 10 between states, the steady-state power consumption of circuit 70 can be reduced without sacrificing switching speed of the write operation. FET 72 is also used to read which of its two states device 10 is in.

Figure 5B:
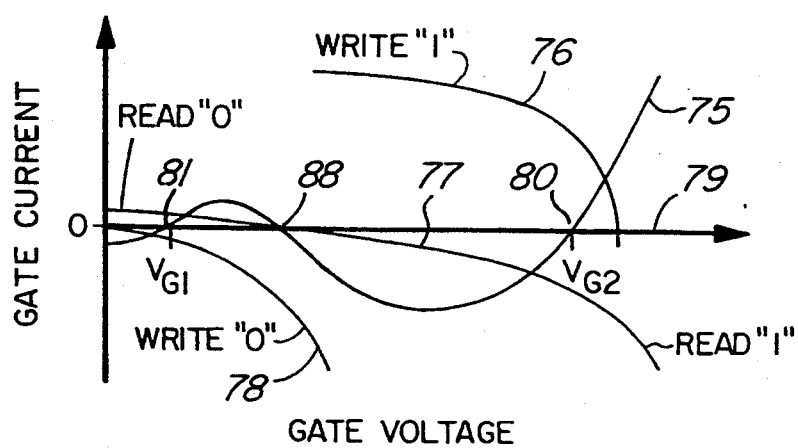

FIG. 5B is plot showing the current-voltage characteristics of circuit 70 shown in FIG. 5A. In FIG. 5B, curve 75 is the gate current-voltage curve for device 10, curve 76 is the load line for FET 72 when FET 72 is biased for a write "1" operation, curve 77 is the load line for FET 72 when FET 72 is biased for a read operation, and curve 78 is the load line for FET 72 when FET 72 is biased for a write "0" operation.

A read is performed by precharging data line 73 to a voltage in the vicinity of $V_S$, (indicated by 88 in FIG. 5B) and applying a voltage in the vicinity of $V_S$ to the gate 74 of FET 72. The gate potential of device 10 is then sampled into data line 73. For gate voltages smaller than $V_S$ there are only leakage currents through FET 72 (i.e. FET 72 is effectively "off"). For gate voltages larger than $V_S$, FET 72 conducts (resulting in a negative gate current). During the read operation, the operating points of circuit 70 lie at the intersections of curve 75 with curve 77 which is the load line for FET 72 when it is in its non-conductive "off" state. Under these conditions, device 10 will not switch states during the read operation.

To write a "1", data line 73 is set to a high voltage and read/write line 74 is grounded (i.e. set to 0 Volts) to turn on FET 72. Under these biasing conditions, there is only one intersection between the gate I-V curve of device 10 and the load line 76 of FET 72. Therefore, the circuit operates at the point indicated by the intersection of curves 75 and 76. The write operation is completed by turning FET 72 off. After FET 72 is turned off, the gate voltage falls from the relatively high voltage indicated by the intersection of curves 75 and 76 to a stable point near the intersection 80 of curve 75 with axis 79 which indicates zero gate current. The stable point is slightly above axis 79 because there is a slight positive gate current due to leakage in FET 72. At the stable point, the gate voltage device 10 is $V_{G2}$.

To write a "0", data line 73 and read/write line 74 are both grounded (i.e. set to 0 Volts). Under these biasing conditions, FET 72 is on and there is only one intersection between the gate I-V curve of device 10 and the load line 78 of FET 72. Therefore, the circuit operates at the point indicated by the intersection of curves 75 and 78. The read operation is completed by turning FET 72 off. After FET 72 is turned off, the gate voltage increases from 0 volts to a stable point at a voltage close to the voltage at intersection 81 of curve 75 with axis 79. The stable point is slightly below axis 79 because there is a slight negative gate current due to leakage in FET 72. At the stable point, the gate voltage device 10 is $V_{G1}$.

The quasi-stable state at operating point 80 (i.e. the point at which gate voltage is $V_{G2}$) may correspond to either or both of decreasing $\alpha_{pnp}$ or decreasing $\alpha_{npn}$ (as shown in FIG. 2). Preferably, the quasi stable state is primarily due to a decrease in $\alpha_{pnp}$ as a result of increasing $W_{pnp}$. Decreases in $\alpha_{npn}$ at higher gate voltages are generally due primarily to saturation of n-p-n device 29. Operating n-p-n device 29 in saturation may slow down the transient response of the memory cell. If $V_{G2}$ corresponds to a decrease in $\alpha_{pnp}$ then, even though device 10 may be in saturation during the transient, when the gate voltage is switched to high values, it will be out of saturation in the steady state. Even if saturation of device 10 is not prevented, the use of a low-lifetime p-n-p structure 27 shortens the turn-off time of device 10.

The transient response of memory cell circuit 70 will be strongly affected by how fast the gate node capacitance of device 10 is charged. The charging rate is determined by the "on" resistance of FET 72. Increasing the width of FET 72 (and consequently decreasing the "on" state resistance of FET 72) will enhance transient response of circuit 70 at the expense of increased cell area.

The advantages of circuit 70 of FIG. 5A over circuit 40 of FIG. 4A are:
1. Circuit 70 does not require negative input voltages as does circuit 40;
2. Only one data line is required;
3. The delay in turn-off due to external anode (or collector) load capacitance is eliminated;
4. In the steady state FET 72 is "off", and, consequently, consumes little power;
5. Fast response can be obtained while maintaining low power consumption because FET switches have low resistance during the transient, but very high resistance in the steady-state; and 6. FET 72 may be integrated with device 10 with BiCMOS processes.

The basis for the operation of circuit 70 is the shape of gate I-V curve 75. As can be seen from Equation (2), there is no need for large anode currents $I_A$ to obtain gate I-V curve 75. Offset current $I_{GR}$ is normally in the picoampere range. So, in principle, the minimum operating current levels for a memory cell according to FIG. 5A should be in the nanoampere range at room temperature and, consequently, the minimum steady-state power consumption for the memory cell of FIG. 5A should be in the nano-Watt range.

While the operation of the invention has been explained so far with reference to a p-n-p-n device 10 it can readily be understood by those skilled in the art that the invention may also be practised with devices that under certain conditions operate in the same manner as a p-n-p-n device. Two examples are metal-n-p-n and p-i-p-n devices. In the former case, holes are injected by forward-biasing the Schottky contact between the metal and n-type layer. In the latter case, hole injection depends upon whether the holes will be able to cross the low-lifetime insulator (i) region. In both cases many holes are injected if sufficient voltage is applied across the metal-n-p or p-i-p regions.

EXAMPLE 1

Figure 6:
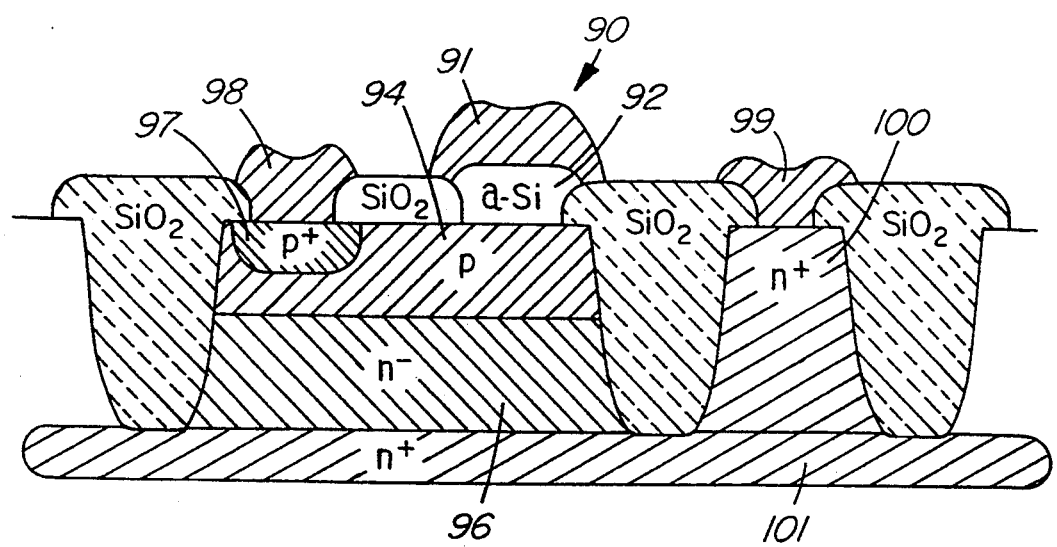
FIG. 6 is a schematic cross section of the structure of a prototype three terminal device having an a-Si/c-Si structure according to the invention.

FIG. 6 shows the physical structure of an experimental prototype of a device 90 according to the invention in cross section. Device 90 comprises a metal anode layer 91, an undoped layer 92 of amorphous Silicon, a crystalline Silicon p-type gate layer 94 and a crystalline silicon n-type cathode layer 96. Amorphous Silicon layer 92 is typically on the order of 0.5 $\mu$m thick. A gate contact 98 is connected to p-type gate layer 94 by a layer 97 of more heavily doped p-type material. A cathode contact 99 is electrically connected to layer 96 through n-type layers 100 and 101. Device 90 may be fabricated, for example, by the methods described in Samuilov et al. *Memory switching effects in a-Si/c-Si heterojunction bipolar structures*, IEEE Electron Device Lett., vol 13, no. 8, p396, 1992 and co-pending application Ser. No. 07/874,467 which are incorporated herein by reference.

In device 90, a thin skin of amorphous Silicon layer 92 adjacent metal anode layer 91 on the order of a few hundred Angstroms thick acts as a p-type layer. This thin skin acts in a manner analogous to p-type layer 19 in device 10 (FIG. 1) and can be considered to be the emitter of a p-n-p structure analogous to p-n-p transistor 27 in device 10. In the p-n-p structure of device 90, the remainder of a-Silicon layer 92 serves as a base and p-type layer 94 serves as a collector. An n-p-n structure analogous to n-p-n transistor 29 in device 10 is formed by p-type base 94, n-type emitter (comprising layers 96, 100, and 101) and a-Silicon collector layer 92.

In contrast with a conventional bipolar transistor, device 90 operates in the inverse mode, (i.e. device 90 is biased with anode contact 91 positive with respect to cathode contact 99 if device 90 were a conventional transistor, anode contact 91 would serve as an emitter, cathode contact 99 would serve as a collector and gate contact 98 would be biased at a positive voltage with respect to anode contact 91.) When the metal/a-Si contact between anode contact 91 and a-Si layer 92 is forward biased it injects holes into the a-Si layer, thus the structure functions as a p-n-p-n device.

Figure 7:
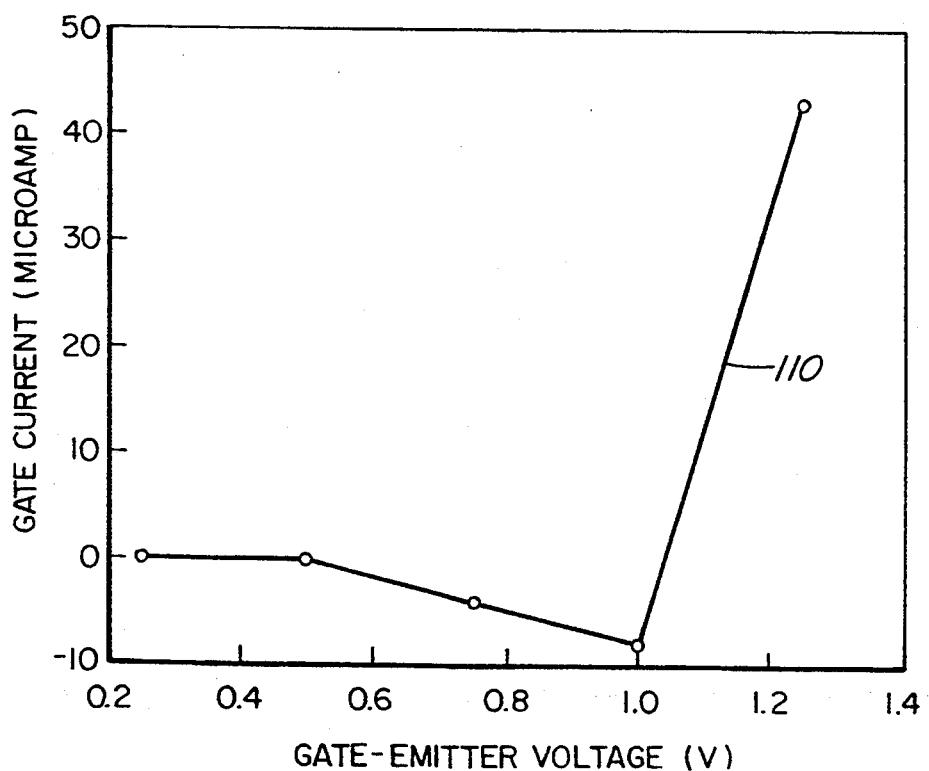
FIG. 7 is a plot of the gate I-V characteristics of the device of FIG. 6.

The gate current-voltage characteristics of device 90 with the collector current limited to 100 $\mu$A and the collector voltage set at 9 Volts are shown in FIG. 7. The breakdown voltage of the collector-base junction due to the punch-through of the a-Si layer was measured to be approximately 10 V. Gate I-V curve 110 contains a negative resistance region between 0.5V and 1 V. The negative resistance appears in the I-V curve when the a-Si region 92 is under nearly punch-through conditions. Under these conditions the width of the undepleted a-Si region is very small, and, consequently, $\alpha_{npn} + \alpha_{pnp} > 1$.

Device 90 was employed in circuit 40 shown in FIG. 4A with gate resistor 51 and anode load resistor 47 of 1.8 k$\Omega$ and 1 k$\Omega$ respectively.

Figure 8A:
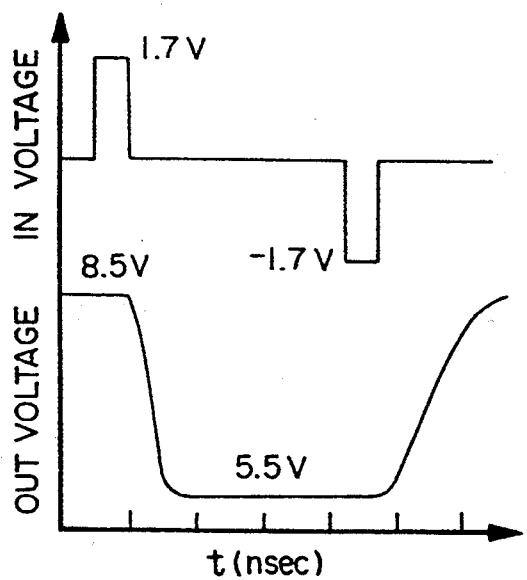
FIGS. 8A and 8B are plots of input and output voltage showing the transient response of the device of FIG. 6 to changes in input voltages.

FIG. 8A shows the operation of device 90 in circuit 40 with a collector supply voltage of 8.5 Volts. The time scale is 200 nanoseconds per division. As shown in FIG. 8A, device 90 is switched between its "0" and "1" states by triggering the gate through the 1.8 k$\Omega$ gate load resistor 51 with positive and negative voltage pulses respectively. Two quasi-stable states exist for 0 V input. One state correspond to a gate-emitter voltage of about 0 V and a collector-emitter voltage of 8.5 V. The second state corresponds to a gate-emitter voltage of about 0.4 V and a collector-emitter voltage of 5.5 V. The turn on time in this measurement is governed by the value of gate load resistor 51. Higher-speed operation can be achieved by using lower gate load resistances.

Figure 8B:
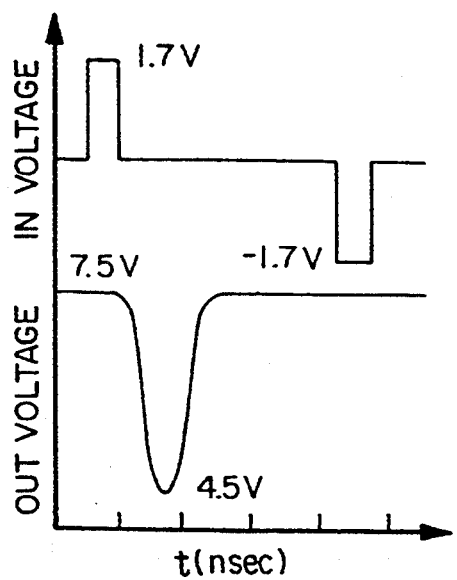

FIG. 8B is a plot of input and output voltages as a function of time for the same circuit used in FIG. 8A, with a collector supply voltage of 7.5 Volts instead of 8.5 Volts. Under these conditions, device 90 exhibits mono-stable operation. Once again the time scale is 200 nanoseconds per division. With a 7.5V supply voltage the minimum of the gate I-V curve is lifted, and, consequently, there is only one intersection of the gate I-V curve with the gate static load line.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:
1. A memory cell comprising:
   a. a four layer semiconductor device comprising a n-type cathode region; a p-type gate region; a third semiconductor region adjacent said gate region, and an anode region adjacent said third semiconductor region;
   b. bias means for applying a bias voltage between said anode and cathode regions, said bias voltage such that a junction between said third semiconductor region and said gate region is reversed biased, said device is in a high impedance "off" state and a gate current-voltage curve of said semiconductor device comprises a negative resistance region;
   c. a data line; and
   d. a gate load element in series electrical connection between said gate region and said data line;
   wherein, when said bias voltage is applied to said device, said memory cell has first and second stable states characterized by gate-cathode voltages $V_{G1}$ and $V_{G2}$ respectively.

2. The memory cell of claim 1 wherein said gate load element comprises a resistor electrically connected in series between said data line and said gate region.

3. The memory cell of claim 1 further comprising pulse switching means for selectively applying positive or negative voltage pulses to said data line for switching said device into said first and second stable states respectively.

4. The memory cell of claim 1 wherein said gate load element comprises a field effect transistor comprising a source, a gate and a drain, said field effect transistor electrically connected by said source and drain between said data line and said gate region and said memory cell further comprises a read/write control line electrically connected to said gate of said field effect transistor.

5. The memory cell of claim 4 wherein said field effect transistor is a PMOS transistor.

6. The memory cell of claim 4 further comprising read/write enablement means for selectively applying to said gate of said field effect transistor an electrical potential sufficient to switch said field effect transistor from a high impedance state to a low impedance state.

7. The memory cell of claim 1 wherein said third semiconductor region is characterized by a punch through voltage and said bias voltage is not more than 15% lower than said punch through voltage.

* * * * *